US005668035A

United States Patent [19]
Fang et al.

[11] Patent Number: 5,668,035
[45] Date of Patent: Sep. 16, 1997

[54] METHOD FOR FABRICATING A DUAL-GATE DIELECTRIC MODULE FOR MEMORY WITH EMBEDDED LOGIC TECHNOLOGY

[75] Inventors: Chung Hsin Fang; Julie Huang; Chen-Jong Wang; Mong-Song Liang, all of Hsin-chu, Taiwan

[73] Assignee: Taiwan Semiconductor Manufacturing Company Ltd., Hsin-chu, Taiwan

[21] Appl. No.: 661,259

[22] Filed: Jun. 10, 1996

[51] Int. Cl.$^6$ .................................................. H01L 21/70
[52] U.S. Cl. ........................ 438/239; 438/241; 438/287
[58] Field of Search .............................. 437/47, 48, 50, 437/52, 60, 919

[56] References Cited

U.S. PATENT DOCUMENTS 5,155,056  10/1992  Jeong-Gyoo ............................. 437/41
5,395,784   3/1995  Lu et al. .................................. 437/52

*Primary Examiner*—Jey Tsai
*Assistant Examiner*—Joni Y. Chang
*Attorney, Agent, or Firm*—George O. Saile

[57] ABSTRACT

A method for fabricating a dual-gate oxide for memory with embedded logic has been achieved. The method is described for forming a thin gate oxide for the peripheral circuits on a DRAM device, while providing a thicker oxide for the memory cells having a boosted word line architecture. The method avoids applying photoresist directly to the gate oxide, and thereby prevents contamination. A first gate oxide is formed on the device areas on the substrate. A first polysilicon layer is deposited and patterned leaving portions over the memory cell areas. The first gate oxide is removed over the peripheral device areas, and is replaced by a thinner second gate oxide. A second polysilicon layer is deposited and patterned to remain over the peripheral device areas. The first and second polysilicon layers, having essentially equal thicknesses, are coated with an insulating layer. The FET gate electrodes for both the peripheral and memory cell areas are simultaneously patterned from the first and second polysilicon layers to complete the DRAM structure up to and including the gate electrodes.

20 Claims, 3 Drawing Sheets

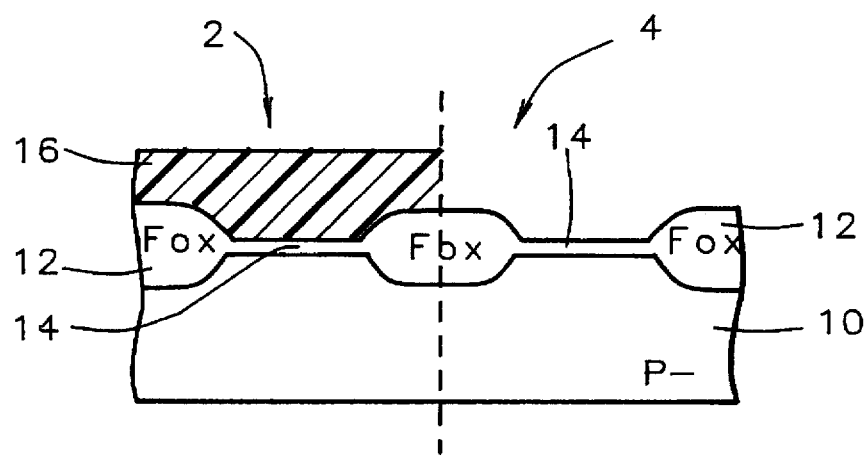
*FIG. 1 - Prior Art*
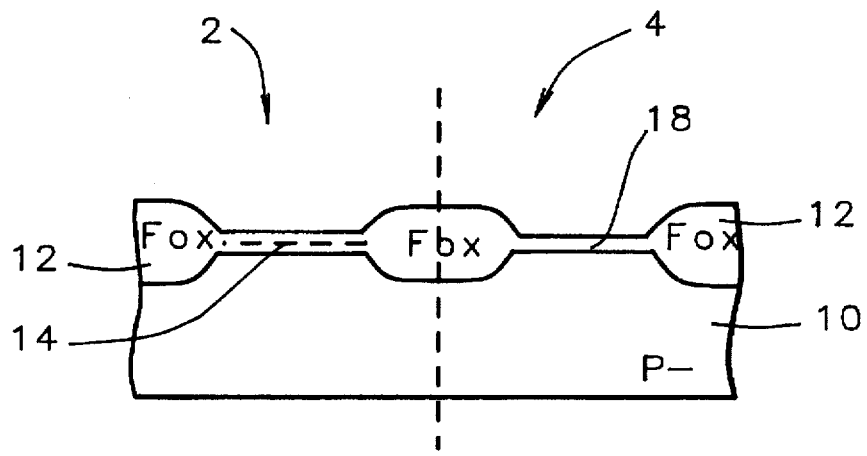
*FIG. 2 - Prior Art*
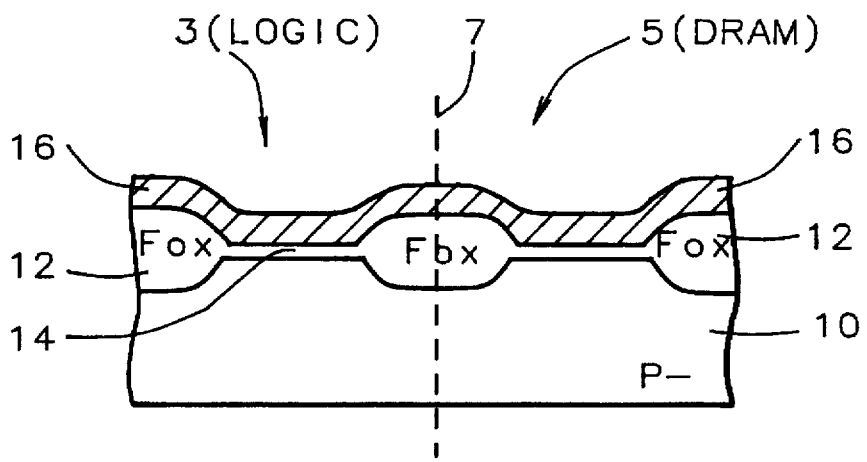
*FIG. 3*

METHOD FOR FABRICATING A DUAL-GATE DIELECTRIC MODULE FOR MEMORY WITH EMBEDDED LOGIC TECHNOLOGY

BACKGROUND OF THE INVENTION

(1) Field of the Invention

The present invention relates to the fabrication of integrated circuit devices on semiconductor substrates, and more particularly relates to a method for fabricating concurrently field effect transistors (FETs) having dual dielectric gate electrodes for memory having embedded logic.

(2) Description of the Prior Art

With the advent of Large Scale Integration (LSI) many of the integrated circuits formed on semiconductor substrates are comprised of several circuit functions on a single chip. For example, dynamic random access memory (DRAM), nonvolatile memory (NVM), and similar memory devices are composed of an array of memory cells for storing digital information, while the peripheral circuits on these devices are typically composed of logic circuits for addressing the memory cells, while other peripheral circuits function as read/write buffers and sense amplifiers.

To improve performance and optimize these devices, it is very desirable in the electronics industry to provide FETs that have both thin and thick gate oxides (dielectrics). Typically, a thin gate oxide (dielectric) is used in the peripheral (logic) circuits to enhance FET device performance, while it is desirable to provide a thicker gate oxide for the higher gate voltage (Vg) requirements on the FET access transistors in the DRAM cells. For example, the FETs in the logic circuits would have a gate voltage of about 3.3 volts, while the access transistor in each of the memory cells would require a gate voltage of 7 volts, such as in the boosted word line architecture in which a 5.0 volt difference between the gate electrode and substrate is required to turn on FETs when the substrate has a voltage bias of about 2 volts.

Typically, by the prior art and as shown in the schematic cross-sectional view in FIG. 1, the dual-gate oxide is formed by thermally growing in the memory cell device area 2 and in the logic device area (peripheral area) 4 a first gate oxide 14 on the substrate 10 having a field oxide (FOX) 12. A photoresist mask 16 is then used to mask the gate oxide 14 over the memory cell device area 2, and the gate oxide 14 is etched in the logic device area 4. FIG. 1 shows the structure prior to etching the gate oxide 14. The photoresist is then stripped and a second gate oxide 18 is grown on the logic device area 4, while the original gate oxide 14 (depicted by the dashed line 14) in the memory cell device area 2 increases in thickness as shown in FIG. 2. Unfortunately, by the method of the prior art, the presence of the photoresist over the gate oxide 14 in the memory device area contaminates the oxide and degrades the device electrical characteristics. For example, one such contaminant is the mobile sodium (Na) ion in the gate oxide that can and does affect the long-term stability of the gate voltage (Vg) on the FET.

Therefore, there is still a strong need in the semiconductor industry for providing a thin gate oxide for the logic areas, and a thicker gate oxide for the memory areas without having the photoresist layer come into direct contact with the gate oxide, and by a method that does not substantially increase the manufacturing process complexity or cost.

SUMMARY OF THE INVENTION

It is therefore a principal object of this invention to provide a method for forming a thin gate oxide for field effect transistors (FETs) on portions of the substrate having the logic circuits, and a thicker gate oxide for the FETs on portions of the substrate having the array of memory cells.

It is another object of this invention to provide the above gate oxides which do not require a photoresist masking layer to come into direct contact with the gate oxide (dielectric).

In accordance with the objects of this embodiment, a method for fabricating a dual-gate oxide for memory having embedded logic is described. The method provides a means for forming a thick gate oxide for the FETs in the memory cell areas while forming a thinner gate oxide for the FETs in the peripheral circuits of the DRAM device.

The method begins by providing a semiconductor substrate composed of a single crystal silicon doped with a P-type dopant (boron). Field OXide (FOX) regions are formed on the semiconductor substrate surrounding and electrically isolating device areas on and in which are formed the FETs for both the logic in the peripheral areas of the chip and for the memory cell areas.

A first gate oxide is now formed on the silicon substrate in both the logic and memory device areas by thermal oxidation. A first polysilicon layer is deposited on the first gate oxide layer and elsewhere on the field oxide regions on the substrate, for example by using low pressure chemical vapor deposition (LPCVD). Using conventional photolithographic techniques and anisotropic plasma etching, the first polysilicon layer is then patterned leaving portions over the memory device areas, while exposing the first gate oxide over the logic device areas. Now the first gate oxide in the logic device areas is removed using a wet oxide etch, for example, using a dilute hydrofluoric/water solution. After removing the first gate oxide and stripping the photoresist layer, a second gate oxide layer, which is thinner than the first gate oxide, is formed by thermal oxidation over the logic device areas. The same thermal oxidation also forms a silicon oxide layer on the patterned first polysilicon layer.

A second polysilicon layer is then deposited over the second gate oxide layer in the logic device areas and over the oxide layer that was formed on the first polysilicon layer during the thermal oxidation used to form the second gate oxide.

Using a photoresist mask and anisotropic plasma etching, the second polysilicon layer is then patterned leaving portions of the second polysilicon layer over the logic device areas. The second polysilicon layer is etched to the silicon oxide layer on the first polysilicon layer over the memory cell device areas. The silicon oxide layer functions as an etch-stop detect layer for the second polysilicon etch. A wet oxide etch, such as hydrofluoric acid, is used to remove the oxide layer on the first polysilicon layer. An insulating layer, preferably deposited by a LPCVD, and using a reactant gas such as tetraethosiloxane (TEOS), is deposited on both the second and first polysilicon layers. The insulating layer and the first and second polysilicon layers are patterned concurrently using photolithographic techniques and anisotropic plasma etching to form the FET polysilicon gate electrodes for both the logic and memory device areas. This completes the formation of the DRAM FET gate electrodes having thin gate oxide in the logic device areas (peripheral areas), and a thicker gate oxide in the memory cell device areas. The DRAM integrated circuit is then completed using conventional processing.

BRIEF DESCRIPTION OF THE DRAWINGS

The objects and other advantages of this invention will become more apparent in the preferred embodiment when read in conjunction with the following drawings.

FIG. 1 shows a prior art schematic cross-sectional view of a portion of a substrate depicting the adjacent logic and memory cell device areas for a partially completed DRAM device after the first gate oxide is formed.

FIG. 2 shows a prior art schematic cross-sectional view for the next step in forming the dual-gate oxide in which the gate oxide 14 in the logic area 2 is increased in thickness when the second gate oxide layer 18 is thermally grown on the logic device area 4.

FIGS. 3 through 9 show schematic cross-sectional views of the preferred embodiment of this invention for fabricating the FET gate electrodes having dual-gate oxides for the DRAM device.

DESCRIPTION OF THE PREFERRED EMBODIMENTS

Figure 4:
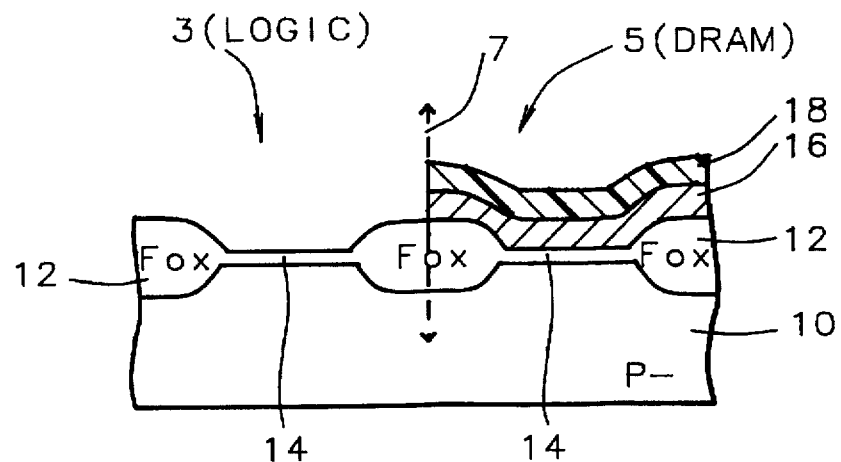

Referring now to FIGS. 3 through 9, a method for forming the dual-gate oxide for memory with embedded logic is described in detail. Although the method of this invention for making the dual-gate oxide is particularly useful for improving the performance of dynamic random access memory (DRAM) devices, it should be well understood by those skilled in the art that the method equally applies to other semiconductor integrated circuits where a dual-gate oxide is desired. The method is also applicable to CMOS circuits where both P doped and N doped wells are provided for making P- and N-channel FETs. The method forms the dual-gate oxide without the photoresist coming in contact with the gate oxides, as is the case in the prior art.

The drawings in FIGS. 3–9 depict the dual-gate oxide process for logic device area 3 and memory cell area 5, having a common boundary 7 to better visualize the process. However, it should be clearly understood that both the logic and memory device areas are typically electrically isolated from each other using a field oxide 12. As is also obvious from the Figs., the dual-gate oxide can also be formed in the same device area if circuit requirements demand it.

Referring now to FIG. 3, a cross-sectional view of a partially completed DRAM cell formed on and in the surface of a semiconductor substrate 10 is shown having a common boundary 7 separating the logic device area 3 (labeled LOGIC in FIG. 3) and memory cell area 5 (labeled DRAM in FIG. 3). The preferred substrate 10 is composed of a P-type single-crystal silicon having a <100> crystallographic orientation. A relatively thick Field OXide (FOX) 12 is formed around the device areas, both memory and logic device areas, to electrically isolate the areas. However, for the purpose of better understanding this embodiment, a portion of the substrate is shown having a common boundary between the adjacent logic and memory areas. This boundary serves to better depict the formation of the two regions, wherein one region has a thin gate oxide for the logic circuit, and the other region has a thicker gate oxide to provide for the high gate voltage ($V_g$) used on the access transistor in the memory cell. The most commonly used field oxide is formed by the method of LOCal Oxidation of Silicon (LOCOS) in which a silicon nitride ($Si_3N_4$) layer (not shown) is deposited and patterned leaving portions over device areas. The substrate 10 is then subjected to a thermal oxidation to oxidize the exposed surface of the silicon substrate to form the field oxide 12, as shown in FIG. 3.

Still referring to FIG. 3, a first gate oxide 14 is formed on the device areas (both logic and memory device areas) by thermal oxidation. The gate oxide 14, which will eventually serve as the gate oxide for the memory cell access transistors, is grown to a thickness of between about 100 and 120 Angstroms. The preferred method of forming the gate oxide 14 is by thermal oxidation in a dry oxygen carried out in an oxidation furnace in a temperature range of between about 780° and 980° C. Alternatively, other oxidation methods can be used, such as oxidation in dry oxygen and anhydrous hydrogen chloride, reduced-pressure, low-temperature high-pressure oxidation, and the like.

A first polysilicon layer 16 is now deposited on the first gate oxide layer 14 and elsewhere on the field oxide regions, as shown in FIG. 3. The polysilicon layer 16 is preferably deposited by LPCVD using, for example, silane ($SiH_4$) as the reactant gas, and is deposited in a temperature range of between about 550° and 600° C. The preferred thickness of layer 16 is between about 1500 and 3000 Angstroms. The polysilicon is then doped by ion implantation using arsenic ($As^{75}$) or phosphorus ($P^{31}$) ions. The dopant concentration after implantation is preferably in the range of between about 1.0 E 18 and 1.0 E 21 atoms/cm$^3$. Alternatively, layer 16 can also be in-situ doped by adding a dopant gas, such as phosphine ($PH_3$) to the chemical vapor deposited (CVD) reactant gas silane.

Using conventional photolithographic techniques a photoresist layer 18 is spin-coated on the first polysilicon layer 16 and patterned leaving portions of the photoresist over the memory device area 5 while exposing the polysilicon layer 16 over the logic device area 3. The first polysilicon layer 16 is then etched to the gate oxide layer 14 over the logic device area 3, as shown in FIG. 4. The etching is carried out using anisotropic plasma etching, for example in a reactive ion etcher (RIE), and using an etchant gas such as chlorine ($Cl_2$) and a carrier gas, such as argon (Ar). This results in selective etching of the polysilicon layer 16 to the gate oxide 14.

The first gate oxide layer 14 is now selectively removed in the logic device area 3 using wet etching, for example, by dip etch in a dilute solution of hydrofluoric acid and water.

Figure 5:
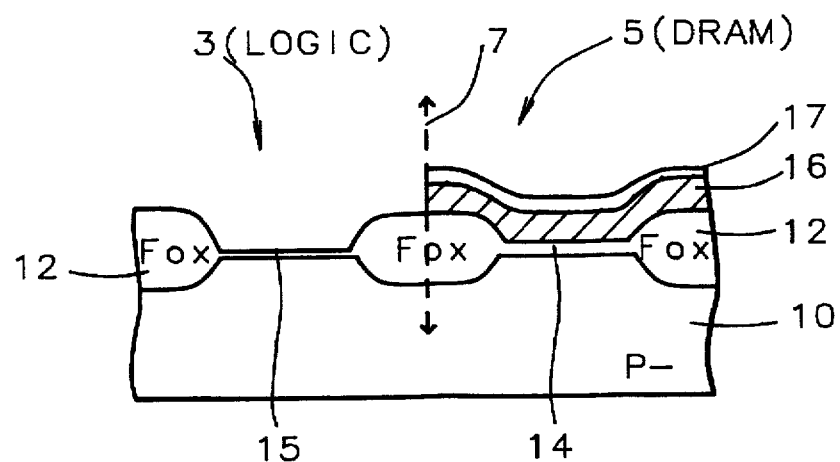

Referring now to FIG. 5, the photoresist layer 18 is removed, a second gate oxide layer 15, which is thinner than the first gate oxide 14, is formed by thermal oxidation over the logic device area 3. The thermal oxidation is preferably carried in an oxidation furnace at a temperature of between about 800° and 900° C. using a dry oxygen, similar to the thermal oxidation used to form the first gate oxide layer. This thermal oxidation also forms a silicon oxide layer 17 on the polysilicon layer 16, as shown in FIG. 5. Preferably the second gate oxide layer 15 is grown to a thickness of between about 70 and 90 Angstroms.

Figure 6:
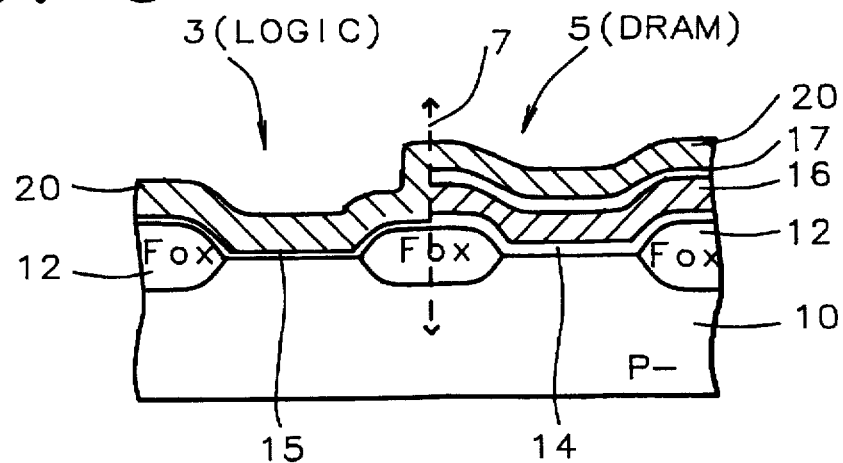

Referring now to FIG. 6, a conformal second polysilicon layer 20 is deposited over the second gate oxide layer 15 in the logic device area 3, and over the oxide layer 17 that was formed on the first polysilicon layer 16 during the thermal oxidation. The second polysilicon layer 20 is deposited by LPCVD similar to the deposition for the first polysilicon layer, having also a thickness of between about 1500 and 3000 Angstroms. Preferably the second and first polysilicon layers, 16 and 20, are deposited to essentially the same thickness. As will be seen at a later step, this is to provide for the concurrent etching of polysilicon layers 16 and 20 over the first and second gate oxide layers 14 and 15, respectively, without resulting in overetching one of the other device area into the silicon substrate 10. The second polysilicon layer 20 is also doped with an N-type dopant, by ion implantation, using, for example, phosphorus ($P^{31}$) ion, and preferably having a concentration of about between 1.0 E 18 and 1.0 E 21 atoms/cm$^3$. The independent doping of polysilicon layers 16 and 20, from which the FET gate electrodes are formed, provides a means for independently controlling doping in both gate electrodes.

Figure 7:
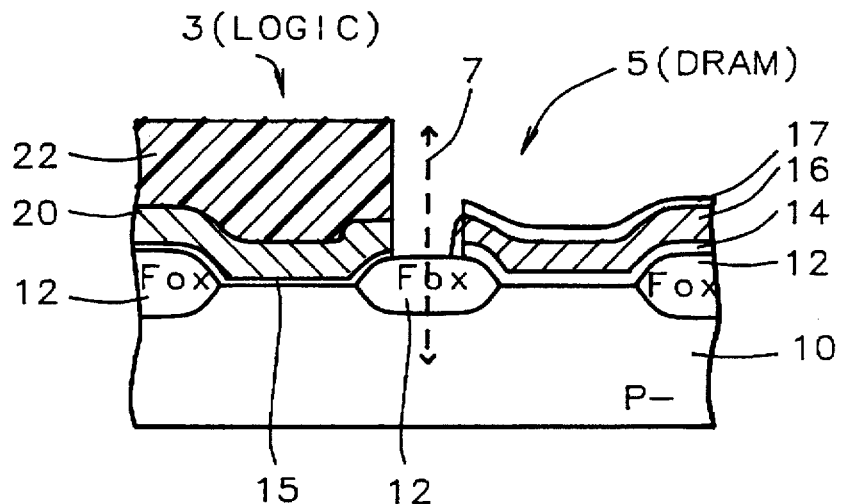

Referring now to FIG. 7, a photoresist mask 22 is patterned over the second polysilicon layer 20 masking the second polysilicon layer over the logic device area 3, and the second polysilicon layer is then etched over the memory cell area 5 to the silicon oxide layer 17 on the first polysilicon layer 16. Layer 20 is etched using anisotropic plasma etching. For example, the etching can be performed in a reactive ion etcher (RIE) using an etchant gas containing chlorine ($Cl_2$). The silicon oxide layer 17 is then removed using a dilute hydrofluoric/water solution. The photoresist layer 22 is removed, for example, using plasma ashing in oxygen ($O_2$).

Figure 8:
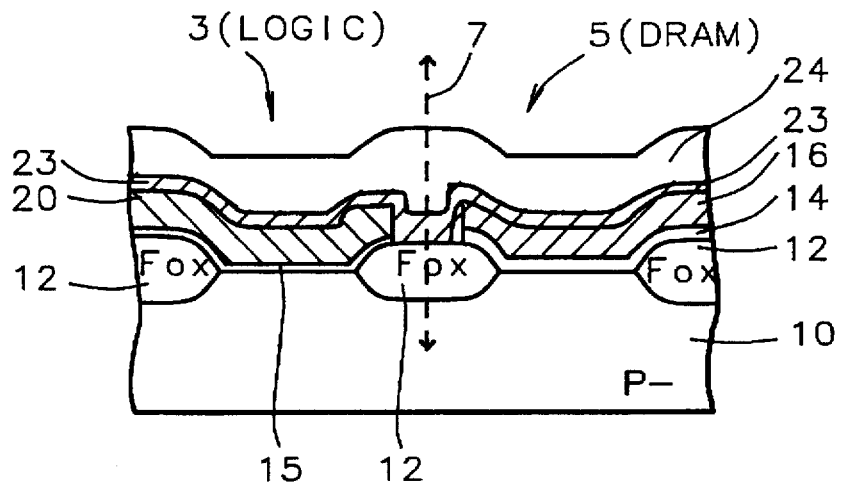

Now referring to FIG. 8, an additional refractory metal silicide layer 23, such as tungsten silicide ($WSi_2$) can be formed on the surface of the first polysilicon layer 16 and the second polysilicon layer 20 to reduce the resistance and to improve circuit performance. An insulating layer 24 is then deposited to facilitate forming self-aligned contacts to the source/drain areas of the FETs that are later formed from polysilicon layers 16 and 20 having the refractory metal silicide layer 23 on their surfaces. Preferably the $WSi_2$ is deposited by CVD using, for example, tungsten hexafluoride ($WF_6$), and the insulating layer 24 can be deposited by LPCVD using a reactant gas such as tetraethosiloxane (TEOS).

Figure 9:
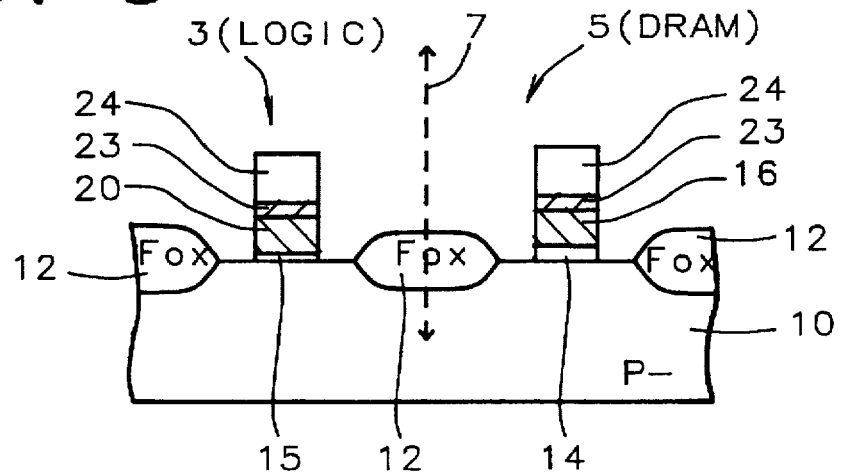

Referring now to FIG. 9, the silicon oxide layer 24 and the first and second polysilicon layers (layers 16 and 20, respectively) are patterned concurrently using conventional photolithographic techniques and anisotropic etching to form the gate electrodes for the FETs having a thin gate oxide 15 in the logic device area 3, and a thicker gate oxide 14 in the memory cell area 5. By providing a first and second polysilicon layer that are of equal thickness, the polysilicon layers are completely removed in the same etch time, thereby avoiding undesirable overetching to form the gate electrodes.

This completes the DRAM device having a thin gate oxide in the peripheral circuit areas for improved circuit performance, while providing a thicker gate oxide required for the memory cells having the boosted word-line architecture. And this invention avoids the need to have the photoresist masking directly on the gate oxide areas.

While the invention has been particularly shown and described with reference to the preferred embodiments thereof, it will be understood by those skilled in the art that various changes in form and details may be made without departing from the spirit and scope of the invention. Although the invention is described for forming a dual-gate oxide for the FETs in the peripheral (logic) circuits and the memory cells on a DRAM device, it should also be understood that the invention applies to any integrated circuit requiring a dual-gate oxide.

What is claimed is:

1. A method for fabricating a dual gate oxide on a semiconductor substrate for field effect transistor gate electrodes comprising the steps of:

forming field oxide areas on said semiconductor substrate surrounding and electrically isolating device areas, said device areas comprised of a first device area and a second device area;

forming a first gate oxide on said first and second device areas by thermal oxidation;

depositing a first polysilicon layer over said first gate oxide layer and elsewhere on said substrate;

patterning by photoresist masking and anisotropic plasma etching said first polysilicon layer leaving portions over said first device area and exposing said first gate oxide over said second device area;

removing said first gate oxide layer from said second device area using a wet oxide etch;

forming a second gate oxide layer by thermal oxidation on said second device area and concurrently forming a silicon oxide layer on said first polysilicon layer;

depositing a second polysilicon layer over said second gate oxide layer in said second device area and over said silicon oxide layer on said first polysilicon layer;

patterning said second polysilicon layer by photoresist masking and anisotropic plasma etching, leaving portions of said second polysilicon layer over said second device area and removing said second polysilicon layer to said silicon oxide layer on said first polysilicon layer over said first device area;

removing said silicon oxide layer on said first polysilicon layer using a wet etch;

depositing an insulating layer on said first and second polysilicon layers;

patterning by photoresist masking and anisotropic plasma etching said insulating layer and concurrently said first and second polysilicon layers, and thereby completing said field effect transistor gate electrodes having said first gate oxide layer over said first device areas and said second gate oxide layer over said second device areas.

2. The method of claim 1, wherein said first device area is the memory device area for a dynamic random access memory (DRAM) device.

3. The method of claim 1, wherein said second device area is the logic device area for the peripheral circuits for a DRAM device.

4. The method of claim 1, wherein said first gate oxide has a thickness of between about 100 and 120 Angstroms.

5. The method of claim 1, wherein said thickness of said second gate oxide has a thickness of between about 70 and 90 Angstroms.

6. The method of claim 1, wherein said first polysilicon layer is doped with phosphorus (P) having a dopant concentration of between about 1.0 E 18 and 1.0 E 21 atoms/$cm^3$.

7. The method of claim 1, wherein said second polysilicon layer is doped with phosphorus (P) having a dopant concentration of between about 1.0 E 18 and 1.0 E 21 atoms/$cm^3$.

8. The method of claim 1, wherein said first polysilicon layer is deposited to a thickness of between about 1000 and 3000 Angstroms.

9. The method of claim 1, wherein said second polysilicon layer is deposited to a thickness of between about 1000 and 3000 Angstroms.

10. The method of claim 1, wherein said insulating layer deposited on said first and second polysilicon layers is deposited by low pressure chemical vapor deposition (LPCVD) using a reactant gas of tetraethosiloxane (TEOS).

11. The method of claim 1, wherein said first and second polysilicon layers have on their surfaces a refractory metal silicide.

12. A method for fabricating a dual gate oxide on a semiconductor substrate for field effect transistor gate electrodes on DRAM devices comprising the steps of:

forming field oxide areas on said semiconductor substrate surrounding and electrically isolating device areas, said device areas being logic device area and memory cell device area;

forming a first gate oxide in said device areas by thermal oxidation;

depositing a first polysilicon layer over said first gate oxide layer and elsewhere on said substrate;

patterning by photoresist masking and anisotropic plasma etching said first polysilicon layer leaving portions over said memory cell device area and exposing said first gate oxide over said logic device area;

removing said first gate oxide layer from said logic device area using a wet oxide etch;

forming a second gate oxide layer by thermal oxidation on said logic device area and concurrently forming a silicon oxide layer on said first polysilicon layer;

depositing a second polysilicon layer over said second gate oxide layer in said logic device area and over said silicon oxide layer on said first polysilicon layer;

patterning said second polysilicon layer by photoresist masking and anisotropic plasma etching, leaving portions of said second polysilicon layer over said logic device area and removing said second polysilicon layer to said silicon oxide layer on said first polysilicon layer over said memory cell device area;

removing said silicon oxide layer on said first polysilicon layer using a wet etch;

depositing on said first and second polysilicon layers an insulating layer;

patterning by photoresist masking and anisotropic plasma etching said insulating layer and concurrently said first and second polysilicon layers, and thereby completing said FET gate electrodes having said first gate oxide layer over said memory cell device area and said second gate oxide layer over said logic device area.

13. The method of claim 12, wherein said first gate oxide has a thickness of between about 100 and 120 Angstroms.

14. The method of claim 12, wherein said thickness of said second gate oxide has a thickness of between about 70 and 90 Angstroms.

15. The method of claim 12, wherein said first polysilicon layer is doped with phosphorus (P) having a dopant concentration of between about 1.0 E 18 and 1.0 E 21 atoms/$cm^3$.

16. The method of claim 12, wherein said second polysilicon layer is doped with phosphorus (P) having a dopant concentration of between about 1.0 E 18 and 1.0 E 21 atoms/$cm^3$.

17. The method of claim 12, wherein said first polysilicon layer is deposited to a thickness of between about 1500 and 3000 Angstroms.

18. The method of claim 12, wherein said second polysilicon layer is deposited to a thickness of between about 1500 and 3000 Angstroms.

19. The method of claim 12, wherein said insulating layer deposited on said first and second polysilicon layers is deposited by low pressure chemical vapor deposition using a reactant gas of tetraethosiloxane.

20. The method of claim 12, wherein said first and second polysilicon layers have on their surfaces a refractory metal silicide.

* * * * *